(12) United States Patent
Bae et al.

(10) Patent No.: US 8,811,097 B2
(45) Date of Patent: Aug. 19, 2014

(54) SEMICONDUCTOR DEVICE CAPABLE OF BLOCK PROTECTION

(75) Inventors: Ji Hyae Bae, Icheon-si (KR); Jung Mi Tak, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 50 days.

(21) Appl. No.: 13/602,006

(22) Filed: Aug. 31, 2012

(65) Prior Publication Data

US 2013/0322191 A1    Dec. 5, 2013

(30) Foreign Application Priority Data

May 31, 2012    (KR) .................. 10-2012-0058227

(51) Int. Cl.
*G11C 7/00*    (2006.01)

(52) U.S. Cl.
USPC ................ 365/189.16; 365/230.03

(58) Field of Classification Search
USPC ...................... 365/189.16, 230.03
See application file for complete search history.

(56) References Cited

U.S. PATENT DOCUMENTS

| 7,325,114 B2 | 1/2008 | DeCaro |
| 8,341,334 B2 * | 12/2012 | Ou ............................. 711/103 |

FOREIGN PATENT DOCUMENTS

| KR | 10-1989-0001098 A | 3/1989 |
| KR | 10-2012-0069954 A | 6/2012 |

* cited by examiner

*Primary Examiner* — Michael Tran
(74) *Attorney, Agent, or Firm* — William Park & Associates Patent Ltd.

(57) ABSTRACT

A semiconductor device includes: a memory cell array comprising a plurality of blocks each comprising a memory cell arranged at an intersection between a word line and a bit line; and a block state information storing unit configured to store state information of the respective blocks. The block state information storing unit stores lock state information to partially limit access to each of the blocks in response to a power-up signal.

19 Claims, 9 Drawing Sheets

US 8,811,097 B2

SEMICONDUCTOR DEVICE CAPABLE OF BLOCK PROTECTION

CROSS-REFERENCES TO RELATED APPLICATION

The present application claims priority under 35 U.S.C. §119(a) to Korean application number 10-2012-0058227, filed on May 31, 2012, in the Korean Intellectual Property Office, which is incorporated herein by reference in its entirety.

BACKGROUND

1. Technical Field

The present invention relates generally to a semiconductor device, and more particularly to a semiconductor memory device capable of protecting blocks.

2. Related Art

In general, a semiconductor memory device is classified into a volatile memory device and a nonvolatile memory device. The volatile memory device requires power to maintain data stored therein, but the semiconductor memory device maintains data stored therein even in absence of the power.

A memory system including the semiconductor memory device such as the nonvolatile memory device may not operate normally when data stored in the semiconductor memory device are unexpectedly changed. Therefore, the memory system including the semiconductor memory device requires a function of protecting data stored in the semiconductor memory device so that the data are not unexpectedly changed. For example, when the memory system is booted up, the semiconductor memory device may enter a lock state so that the data stored therein are not changed. The lock state means a state of the semiconductor memory device (e.g., nonvolatile memory device), in which a program operation or erase operation is not performed.

The semiconductor memory device may enter a protection mode (e.g., the lock state) through various methods. For example, the semiconductor memory device may enter the lock state according to a command provided from outside. As another example, the semiconductor memory device may enter the lock state according to a specific signal inputted through a physical pin.

SUMMARY

A semiconductor device including a storing unit for setting a lock state of a data storage area is described herein.

In an embodiment of the present invention, a semiconductor device includes: a memory cell array divided into a plurality of blocks each comprising a memory cell arranged at an intersection between a word line and a bit line; and a block state information storing unit configured to store state information of the respective blocks. The block state information storing unit simultaneously stores lock state information to partially limit access to each of the blocks in response to a power-up signal.

The block state information storing unit may further include a write driver configured to control a program operation for the unit cells.

When the unit cells store lock-down state information to limit all access to the blocks, the write driver may control the state information stored in the unit cells not to be changed.

BRIEF DESCRIPTION OF THE DRAWINGS

Features, aspects, and embodiments are described in conjunction with the attached drawings, in which.

DETAILED DESCRIPTION

Figure 1:
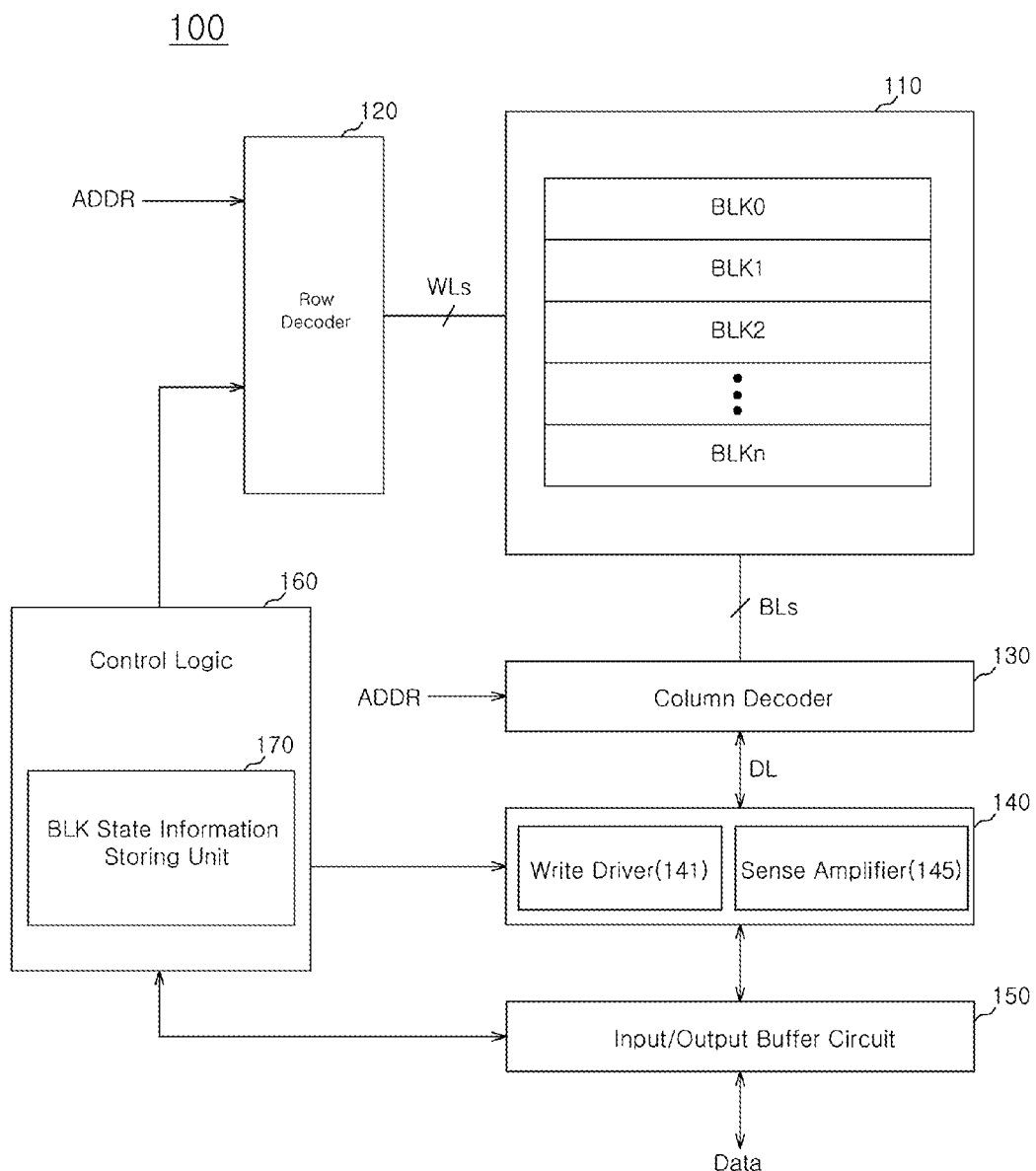
FIG. 1 is a block diagram illustrating a semiconductor memory device according to an embodiment of the present invention.

Hereinafter, a semiconductor device according to the present invention will be described below with reference to the accompanying drawings through exemplary embodiments. However, the present invention is not limited to the embodiments to be described herein, but may be embodied into other forms. The embodiments are provided to describe the present invention such that the concept of the present invention may be easily understood by those skilled in the art.

In the drawings, the embodiments of the present invention are not limited to illustrated specific forms, but are exaggerated for clarity. In this specification, specific terms are used to describe the present invention, but do not limit the scope of the present invention.

In this specification, terms such as and/or include any item among combinations of a plurality of related items or the plurality of related items. Furthermore, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. The terminology used herein is for the purpose of describing particular embodiments only and is not intended to be limiting of the invention. As used herein, the singular forms are intended to include the plural forms as well, unless the context clearly indicates otherwise. It will be further understood that the terms "comprise", "comprising", "have" and/or "having", when used herein, specify the presence of stated features, integers, steps, operations, elements, and/or components, but do not preclude the presence or addition of one or more other features, integers, steps, operations, elements, components, and/or groups thereof.

According to an embodiment of the present invention, the semiconductor memory device may enter the lock state according to information stored in a storing unit for setting a lock state of a data storage area. In this case, the storing unit for setting the lock state of the data storage area may be configured in various manners depending on cell types. The storing unit for setting the lock state of the data storage area may be configured to operate quickly for high reliability.

FIG. 1 is a block diagram illustrating a semiconductor memory device according to an embodiment of the present invention. Referring to FIG. 1, the semiconductor memory device 100 includes a memory cell array 110, a row decoder 120, a column decoder 130, a data read/write circuit 140, an input/output buffer circuit 150, and a control logic 160.

The memory cell array 110 includes a plurality of memory blocks BLK0 to BLKn. Each of the memory blocks BLK0 to BLKn includes a plurality of memory cells arranged at the intersections between word lines WLs and bit lines BLs. In the case of known flash memory devices, the erase operation can only be performed on a memory block basis, and thus all the memory cells in a memory block must be erased together.

Although not illustrated, each of the memory cells may store one-bit data. Such a memory cell is referred to as a single level cell (SLC). As another example, each of the memory cells may store two or more-bit data. Such a memory cell is referred to as a multi-level cell (MLC). The MLC is programmed to have a threshold voltage corresponding to any one of an erase state and a plurality of program states, according to multi-bit data.

The row decoder 120 operates according to various control signals of the control logic 160. The row decoder 120 is connected to the memory cell array 110 through the word lines WLs. The row decoder 120 is configured to decode an inputted address ADDR. The row decoder 120 provides a bias voltage to a selected word line and an unselected word line according to the decoding result.

The column decoder 130 is connected to the memory cell array 110 through the bit lines BLs. The column decoder 130 is configured to decode an inputted address ADDR. The column decoder 130 is configured to electrically connect the selected bit line and a data line DL according to the decoding result. The column decoder 130 may be included in the data read/write circuit 140.

The data read/write circuit 140 operates according to the various control signals of the control logic 160. The data read/write circuit 140 may include a write driver 141 and a sense amplifier 145. The write driver 141 is configured to program data into a selected memory cell of the memory cell array 110 during a write operation. The sense amplifier 145 is configured to read data stored in the selected memory cell during a read operation or verify read operation.

The input/output buffer circuit 150 is configured to receive data from an external device (for example, a memory controller, a memory interface, a host device or the like) or output data to the external device.

The control logic 160 is configured to control overall operations of the semiconductor memory device 100 in response to a command provided from the external device. For example, the control logic 160 may control read, program (or write), and erase operations of the semiconductor memory device 100. The control logic 160 includes a block state information storing unit 170.

The block state information storing unit 170 operates according to the various control signals of the control logic 160. The block state information storing unit 170 is configured to store state information of the respective memory blocks BLK0 to BLKn of the memory cell array 110. Here, the state information may indicate whether the respective memory blocks BLK0 to BLKn can be accessed or not. For example, the state information may be divided into a lock state, an unlock state, and a lock-down state. The states of the memory blocks BLK0 to BLKn will be described in detail with reference to FIG. 2.

The control logic 160 is configured to access the respective memory blocks BLK0 to BLKn according to the block state information stored in the block state information storing unit 170. For example, the control logic 160 refers to the information stored in the block state information storing unit 170 before accessing a selected memory block. The control logic 160 may access the selected block or may not access the selected block, depending on the reference result. That is, the control logic 160 may perform a function of protecting the memory block according to the block state information stored in the block state information storing unit 170.

Figure 2:
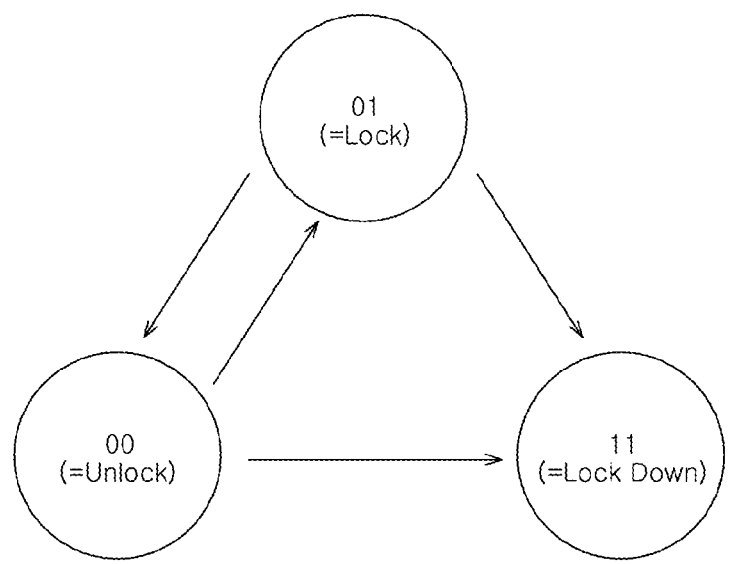
FIG. 2 is a conceptual diagram explaining the control of a lock state of a memory area of FIG. 1.

FIG. 2 is a conceptual diagram explaining the control of the lock state of the memory area of FIG. 1. Referring to FIGS. 1 and 2, the states of the memory blocks BLK0 to BLKn of the semiconductor memory device 100 may be defined as three states, e.g., the lock state, the unlock state, and the lock-down state.

The unlock state means a state in which a memory block can be accessed. For example, when the state of the memory block is set to the unlock state, read, program (or write), and erase operations may be performed on the corresponding memory block. For example, the unlock state of the memory block may be set by programming data '00' in the block state information storing unit 170 as information of the corresponding memory block.

The lock state means a state in which a memory block cannot be accessed. For example, when the state of the memory block is set to the lock state, program and erase operations cannot be performed on the corresponding memory block. On the other hand, when the state of the memory block is set to the lock state, a read operation may be performed on the corresponding memory block. For example, the lock state of the memory block may be set by programming data '01' in the block state information storing unit 170 as information of the corresponding memory block. For example, while power is supplied to the semiconductor memory device 100 (for example, during power-up operation), all of the memory blocks BLK0 to BLKn should be set to the lock state.

The lock-down state means a state in which a memory block cannot be accessed. For example, when the state of the memory block is set to the lock-down state, read, program, and erase operations cannot be performed on the corresponding memory block. A difference between the lock state and the lock-down state lies in whether a read operation can be performed or not. For example, the lock-down state of the memory block may be set by programming data '11' in the block state information storing unit 170 as information of the corresponding memory block. For example, the lock-down state cannot be changed before the power-up operation of the semiconductor memory device 100 is newly performed.

As described above, in order to set the states of the memory blocks BLK0 to BLKn into the lock state, the unlock state, and the lock-down state, a storage area for setting the states of the memory blocks BLK0 to BLKn may be required. Therefore, the semiconductor memory device 100 may set the states of the memory blocks BLK0 to BLKn using the block state information storing unit 170.

Figure 3:
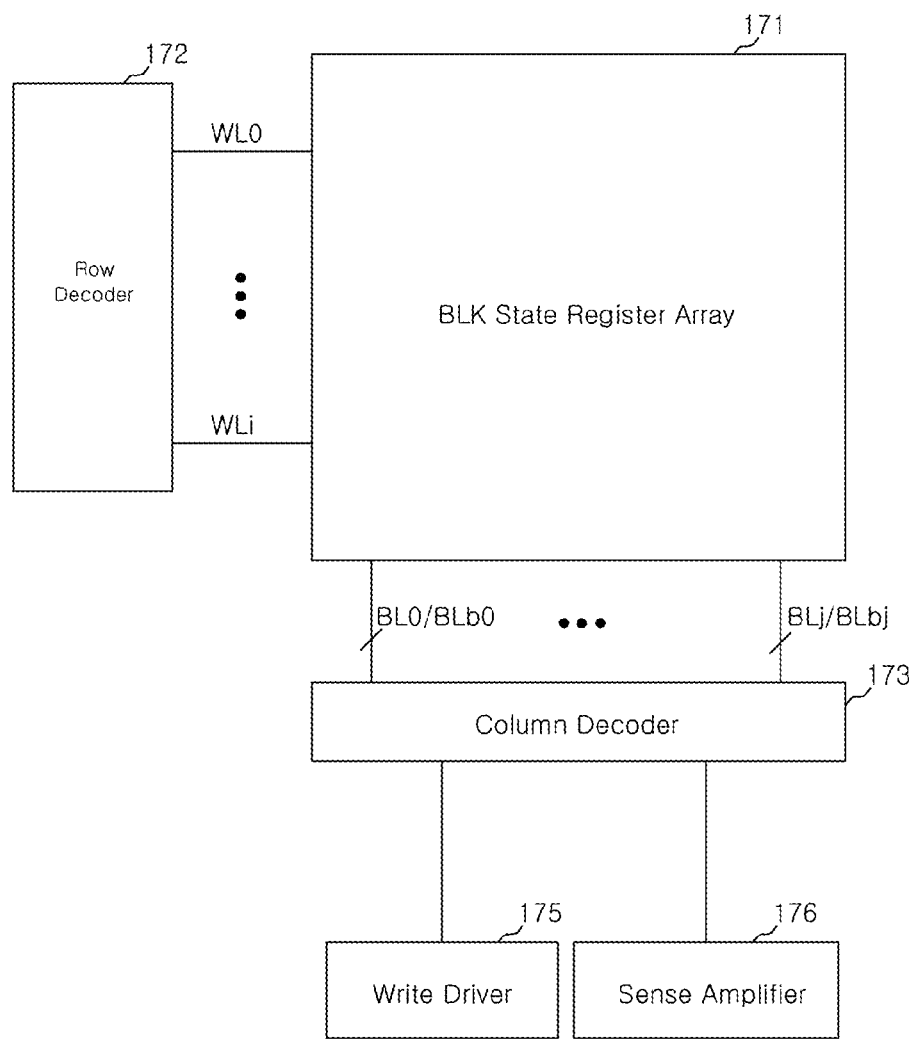
FIG. 3 is a block diagram illustrating a block state information storing unit according to an embodiment of the present invention.

FIG. 3 is a block diagram illustrating the block state information storing unit according to an embodiment of the present invention. Referring to FIG. 3, the block state information storing unit 170 includes a block state register array 171, a row decoder 172, a column decoder 173, a write driver 175, and a sense amplifier 176.

The block state register array 171 includes a plurality of unit cells (not illustrated). The plurality of unit cells are arranged at the intersections between word lines WL0 to WLi and bit line pairs BL0/BLb0 to BLj/BLbj. The respective unit cells are configured to store the states of the corresponding memory blocks BLK0 to BLKn of FIG. 1. The unit cells for storing the states of the memory blocks BLK0 to BLKn will be described in detail with reference to FIGS. 4 to 6.

The row decoder 172 is connected to the block state register array 171 through the word lines WL0 to WLi. The row decoder 172 is configured to enable a selected word line according to the control of the control logic 160. The column decoder 173 is connected to the block state register array 171 through the bit line pairs BL0/BLb0 to BLj/BLbj. The column decoder 173 is configured to enable a selected bit line pair according to the control of the control logic 160.

The write driver 175 is configured to program data (e.g., state information of the each blocks) into the respective unit cells of the block state register array 171 according to the control of the control logic 160. The write driver 175 will be described with reference to FIGS. 7 and 8. The sense amplifier 176 is configured to read data (e.g., the state information of the each blocks) from the respective unit cells of the block state register array 171 according to the various control signals of the control logic 160.

Figure 4:
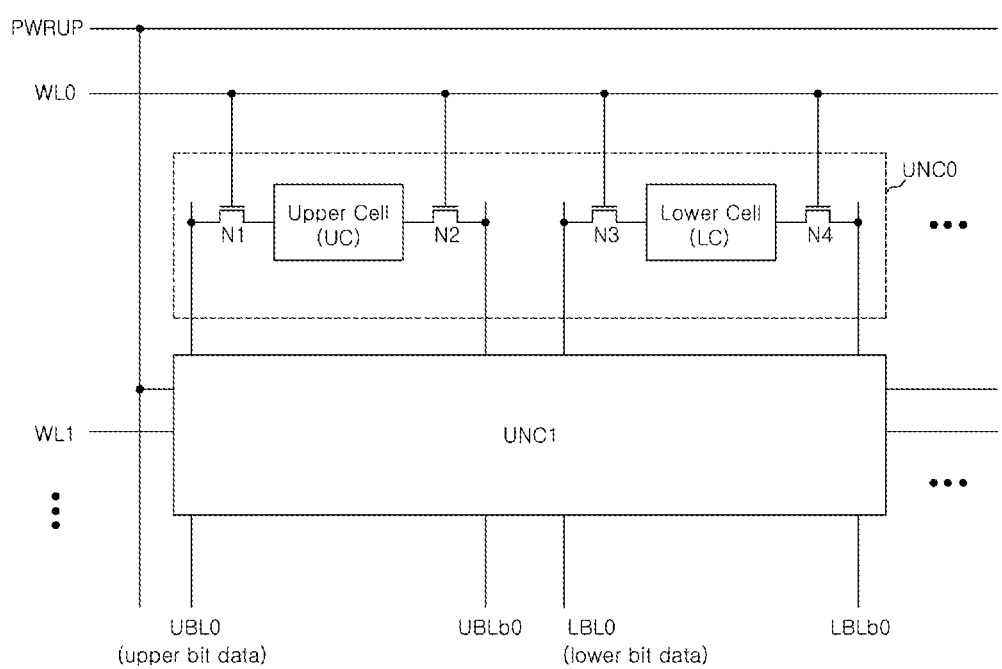
FIG. 4 is a block diagram illustrating unit cells of the block state information storing unit of FIG. 3.

FIG. 4 is a block diagram illustrating unit cells of the block state information storing unit of FIG. 3. Referring to FIG. 4, the block state register array 171 includes a plurality of unit cells UNC0, UNC1, . . . .

As described above, the respective unit cells UNC0, UNC1, . . . are configured to store the state information of the corresponding memory blocks BLK0 to BLKn. Therefore, the number of the unit cells may correspond to the number of the memory blocks. In addition, the respective unit cells UNC0, UNC1, . . . may have the same configuration. For convenience of explanation, the following descriptions will be focused on the unit cell UNC0 corresponding to the memory block BLK0.

As described with reference to FIG. 2, the state of the memory block BLK0 may be expressed as two-bit data. For example, the unlock state is expressed as '00', the lock state is expressed as '01', and the lock-down state is expressed as '11'. Therefore, the unit cell UNC0 is configured to store two-bit data. For example, the unit cell UNC0 includes an upper cell UC and a lower cell LC. The upper cell UC is configured to store an upper bit of the state information, and the lower cell LC is configured to store a lower bit of the state information.

The upper cell UC of the unit cell UNC0 is connected to a word line WL0 and an upper bit line pair UBL0 and UBLb0. The upper cell UC may be connected to the upper bit line pair UBL0 and UBLb0 through selecting elements N1 and N2 which are turned on when the word line WL0 is enabled. Similarly, the lower cell LC of the unit cell UNC0 is connected to the word line WL0 and a lower bit line pair LBL0 and LBLb0. The lower cell LC may be connected to the lower bit line pair LBL0 and LBLb0 through selecting elements N3 and N4 which are turned on when the word line WL0 is enabled.

According to an embodiment of the present invention, a power-up signal PWRUP is provided to the respective unit cells UNC0, UNC1, . . . . Here, the power-up signal PWRUP may be enabled when power corresponding to a predetermined voltage level or more starts to be supplied to the semiconductor memory device 100. When the power-up signal PWRUP is provided, the unit cells UNC0, UNC1, . . . may store data '01' indicating the lock state. Therefore, the semiconductor memory device 100 does not need to perform program operations for changing the states of the blocks BLK0 to BLKn into the lock state on the respective unit cells UNC0, UNC1, . . . , during the power-up operation. The configuration of the unit cells UNC0, UNC1, . . . according to an embodiment of the present invention will be described with reference to FIGS. 5 and 6.

Figure 5:
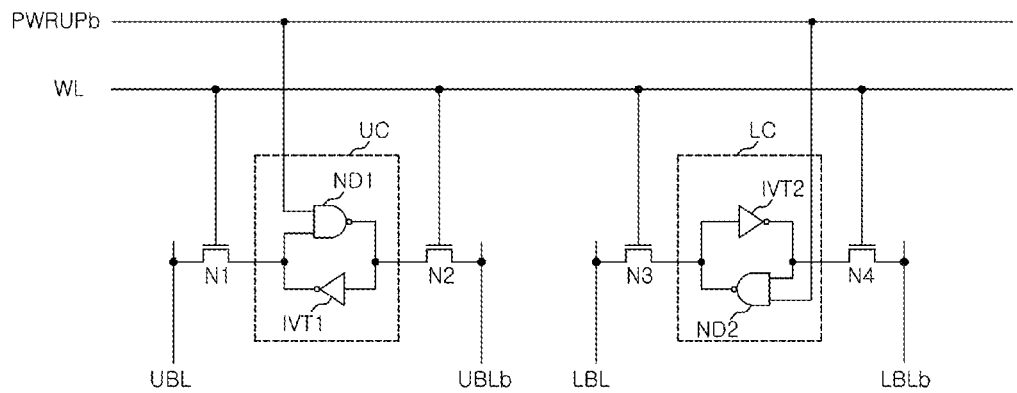
FIG. 5 is a circuit diagram illustrating a unit cell of the block state information storing unit of FIG. 3.

FIG. 5 is a circuit diagram illustrating a unit cell of the block state information storing unit of FIG. 3. Referring to FIG. 5, each of upper and lower cells UC and LC of the unit cell UNC_A includes a plurality of logic gates. The unit cell UNC_A operates in response to a low active power-up signal PWRUPb.

The upper cell UC includes a NAND gate ND1 and an inverter IVT1. The NAND gate ND1 and the inverter IVT1 are connected to each other such that an output signal of the NAND gate ND1 is inputted to the inverter IVT1 and an output signal of the inverter IVT1 is inputted to the NAND gate ND1. The output signal of the NAND gate ND1 is outputted to an upper bit line bar UBLb through a selecting element N2. Furthermore, the output signal of the inverter IVT1 is outputted to an upper bit line UBL through a selecting element N1.

The power-up signal PWRUPb is provided to the NAND gate ND1. When the power-up signal PWRUPb is activated, the NAND gate ND1 outputs data '1' regardless of the output signal of the inverter IVT1. That is, the NAND gate ND1 outputs data '1' when the power-up signal PWRUPb is activated to data '0'. The inverter IVT1 outputs data '0' in response to the output signal (i.e., data '1') of the NAND gate ND1. If the data of the upper cell UC is sensed through the upper bit line UBL, the upper cell UC has data '0' during the power-up operation of the semiconductor memory device 100.

The lower cell LC includes a NAND gate ND2 and an inverter IVT2. The NAND gate ND2 and the inverter IVT2 are connected to each other such that an output signal of the NAND gate ND2 is inputted to the inverter IVT2 and an output signal of the inverter IVT2 is inputted to the NAND gate ND2. The output signal of the NAND gate ND2 is outputted to a lower bit line LBL through a selecting element N3. Furthermore, the output signal of the inverter IVT2 is outputted to a lower bit line bar LBLb through a selecting element N4.

The power-up signal PWRUPb is provided to the NAND gate ND2. When the power-up signal PWRUPb is enabled, the NAND gate ND2 outputs data '1' regardless of the output signal of the inverter IVT2. That is, the NAND gate ND2 outputs data '1' when the power-up signal PWRUPb is activated to data '0'. If the data of the lower cell LC is sensed through the lower bit line LBL, the lower cell LC has data '1' during the power-up operation of the semiconductor memory device 100.

Therefore, the upper cell UC has data '0' in response to the power-up signal PWRUPb, and the lower cell LC has data '1' in response to the power-up signal PWRUPb. That is, during the power-up operation of the semiconductor memory device 100, the unit cell UNC_A stores two-bit data '01' indicating the lock state in response to the power-up signal PWRUPb, without a program operation through the bit line.

Figure 6:
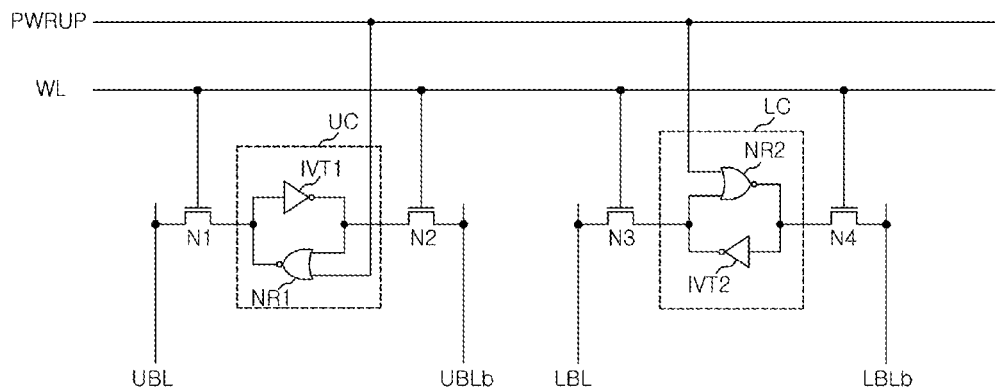
FIG. 6 is another circuit diagram of the unit cell of the block state information storing unit of FIG. 3.

FIG. 6 is another circuit diagram of the unit cell of the block state information storing unit of FIG. 3. Referring to FIG. 6, each of upper and lower cells UC and LC of the unit cell UNC_B includes a plurality of logic gates. The unit cell UNC_B operates in response to a high active power-up signal PWRUP.

The upper cell UC includes a NOR gate NR1 and an inverter IVT1. The NOR gate NR1 and the inverter IVT1 are connected to each other such that an output signal of the NOR gate NR1 is inputted to the inverter IVT1 and an output signal of the inverter IVT1 is inputted to the NOR gate NR1. The output signal of the NOR gate NR1 is outputted to the upper bit line UBL through a selecting element N1. Furthermore, the output signal of the inverter IVT1 is outputted to the upper bit line bar UBLb through a selecting element N2.

The power-up signal PWRUP is provided to the NOR gate NR1. When the power-up signal PWRUP is activated, the NOR gate NR1 outputs data '0' regardless of the output signal of the inverter IVT1. That is, the NOR gate NR1 outputs data '0' when the power-up signal PWRUP is activated to data '1'. If data of the upper cell UC is sensed through the upper bit line UBL, the upper cell UC has data '0' during the power-up operation of the semiconductor memory device 100 of FIG. 1.

The lower cell LC includes a NOR gate NR2 and an inverter IVT2. The NOR gate NR2 and the inverter IVT2 are connected to each other such that an output signal of the NOR gate NR2 is inputted to the inverter IVT2 and an output signal of the inverter IVT2 is inputted to the NOR gate NR2. The output signal of the NOR gate NR2 is outputted to the lower bit line bar LBLb through the selecting element N4. Furthermore, the output signal of the inverter IVT2 is outputted to the lower bit line LBL through the selecting element N3.

The power-up signal PWRUP is provided to the NOR gate NR2. When the power-up signal PWRUP is activated, the NOR gate NR2 outputs data '0' regardless of the output signal of the inverter IVT2. That is, the NOR gate NR2 outputs data '0' when the power-up signal PWRUP is activated to data '1'. If data of the upper cell LC is sensed through the lower bit line LBL, the lower cell LC has data '1' during the power-up operation of the semiconductor memory device 100.

Therefore, the upper cell UC has data '0' in response to the power-up signal PWRUP, and the lower cell LC has data '1' in response to the power-up signal PWRUP. That is, during the power-up operation of the semiconductor memory device 100, the unit cell UNC_B stores two-bit data '01' indicating the lock state in response to the power-up signal PWRUP, without a program operation through the bit line.

Figure 7:
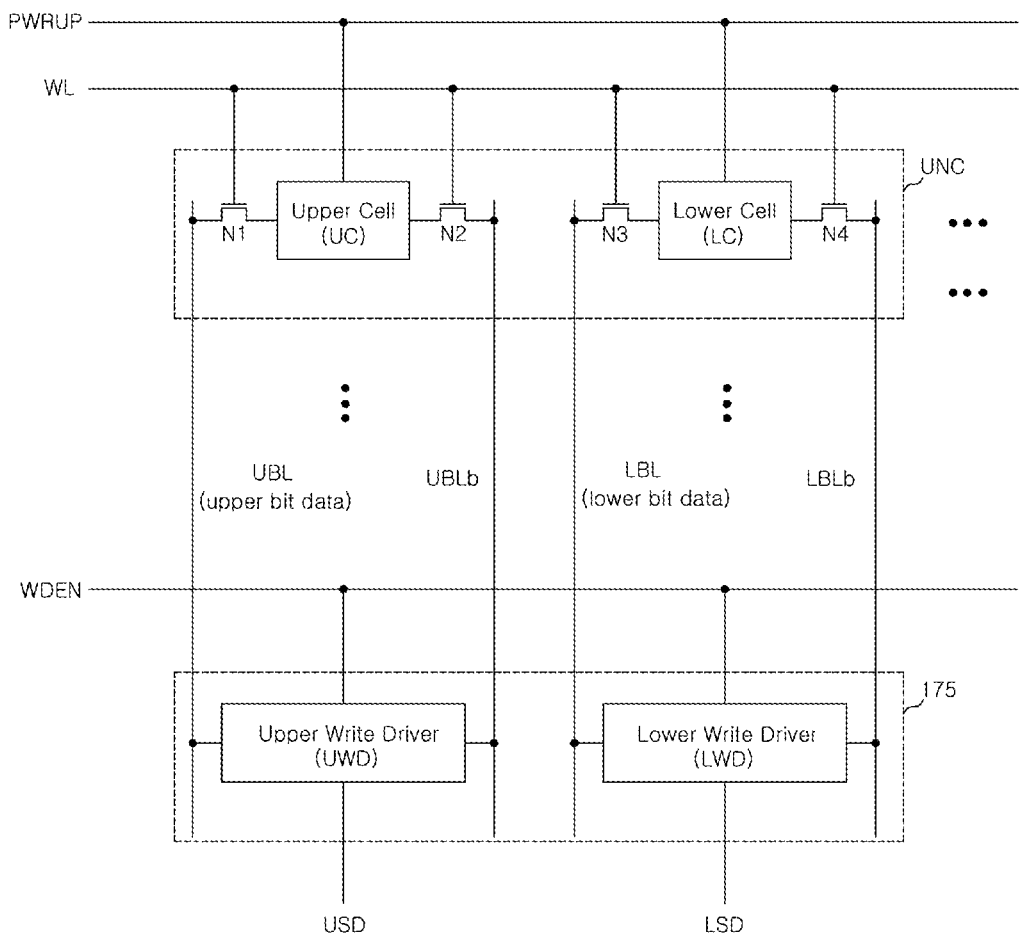
FIG. 7 is a block diagram illustrating a write driver of the block state information storing unit of FIG. 3.

FIG. 7 is a block diagram illustrating the write driver of the block state information storing unit of FIG. 3. For convenience of description, FIG. 7 illustrates only one unit cell UNC of the block state register array 171 of FIG. 3.

Referring to FIG. 7, the unit cell UNC of the block state register array 171 is configured to store two-bit data. For example, the unit cell UNC includes an upper cell UC for storing an upper bit of the block state information and a lower cell LC for storing a lower bit of the block state information.

The write driver 175 of the block state information storing unit 170 includes an upper write driver UWD and a lower write driver LWD. The upper write driver UWD is connected to the upper cell UC of the unit cell UNC through an upper bit line pair UBL and UBLb. The upper write driver UWD is configured to program data into the upper cell UC according to a write driver enable signal WDEN and upper state information USD. The lower write driver LWD is connected to the lower cell LC of the unit cell UNC through a lower bit line pair LBL and LBLb. The lower write driver LWD is configured to program data into the lower cell LC according to the write driver enable signal WDEN and lower state information LSD.

According to an embodiment of the present invention, the upper write driver UWD is configured not to change data '1' programmed in the upper cell UC, even through the upper write driver UWD is enabled by an operation performed after programming the data '1' into the upper cell UC, no matter whether the operation has been performed normally or has failed. As described with reference to FIG. 2, the lock-down state cannot be changed before the power-up operation of the semiconductor memory device 100 is newly performed. Therefore, the upper write driver UWD may operate to maintain the data '1' programmed in the upper cell UC, before the power-up operation of the semiconductor memory device 100 is newly performed. The configuration of the upper write driver UWD will be described in detail with reference to FIG. 8.

Figure 8:
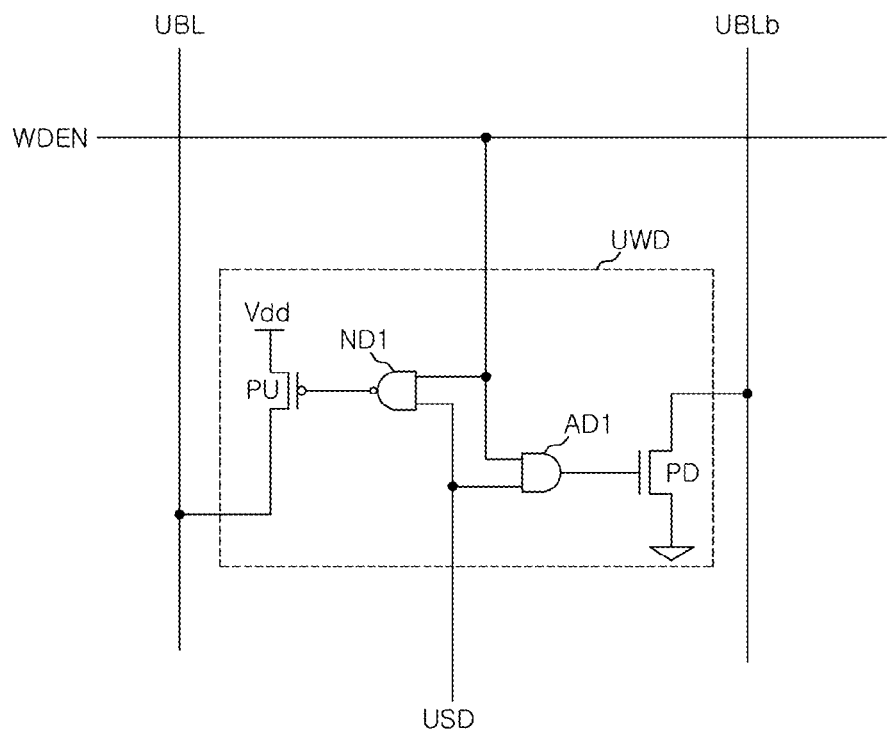
FIG. 8 is a circuit diagram illustrating an upper write driver of the block state information storing unit of FIG. 7.

FIG. 8 is a circuit diagram illustrating the upper write driver of the block state information storing unit of FIG. 7. Referring to FIG. 8, the upper write driver UWD includes a plurality of logic gates ND1 and AD1, a pull-up transistor PU, and a pull-down transistor PD.

For example, the pull-up transistor PU is connected between the upper bit line UBL and a power supply stage, and an output terminal of the NAND gate N1 is connected to a gate of the pull-up transistor PU. The NAND gate ND1 is configured to operate in response to the write driver enable signal WDEN and the upper state information USD. The pull-down transistor PD is connected between the upper bit line UBLb and a ground stage, and an output terminal of the AND gate AD1 is connected to a gate of the pull-down transistor PD. The AND gate AD1 is configured to operate in response to the write driver enable signal WDEN and the upper state information USD.

Suppose that the write driver enable signal WDEN is activated to data '1' and the upper state information USB corresponds to data '1' for programming the upper cell UC into the lock-down state. In this case, the NAND gate ND1 outputs data '0'. When the pull-up transistor PU is turned on in response to an output signal of the NAND gate ND1, data '1' may be programmed into the upper cell UC.

On the other hand, suppose that the write driver enable signal WDEN is activated to data '1' by an operation, no matter whether the operation has been performed normally or has failed, and the upper state information USD corresponds to data '0' for programming the upper cell UC into states other than the lock-down state. In this case, the NAND gate ND1 outputs data '1'. Since the pull-up transistor PU is turned off in response to the output signal of the NAND gate ND1, the data of the upper cell UC is not changed. That is, except that the data of the upper cells UC are simultaneously (or collectively) changed by the power-up operation, the states of upper cells UC programmed as data '1' indicating the lock-down state cannot be changed by the upper write driver UWD.

Figure 9:
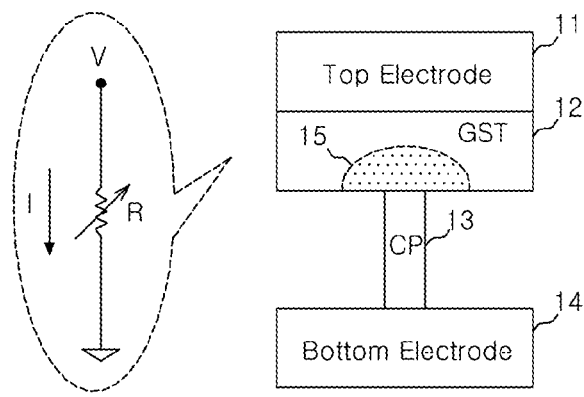
FIG. 9 is a diagram explaining a memory element of the memory cell array of FIG. 1.

FIG. 9 is a diagram explaining a memory element of the memory cell array of FIG. 1.

According to an embodiment of the present invention, the semiconductor memory device 100 of FIG. 1 may include a phase change memory device. However, the semiconductor memory device 100 is not limited to the phase change memory device. For example, the semiconductor memory device 100 may include one or more of a NAND flash memory device, a NOR flash memory device, an FRAM using a ferroelectric capacitor, an MRAM using a TMR layer.

Memory cells (not illustrated) included in the memory cell array 110 of the semiconductor memory device 100 may include phase change memory cells. Each of the memory cells includes a memory element and a selecting element. FIG. 9 briefly illustrates the memory element of the memory cell.

The memory element 16 has a variable resistance value depending on an applied current I. Therefore, the memory element 16 is also referred to as a resistance element. Referring to FIG. 9 illustrating the cross-section of the memory element 16, the memory element 16 includes a top electrode 11, a phase change material (GST) 12, a contact plug (CP) 13, and a bottom electrode 14.

The top electrode 11 is connected to a bit line BL, and the bottom electrode 14 is connected between the CP 13 and the selecting element (not illustrated). The CP 13 is formed of a conductive material (for example, TiN or the like). The CP 13 is also referred to as a heater plug. The GST 12 is formed between the top electrode 11 and the CP 13.

The phase of the GST 12 changes depending on the magnitude of a supplied current and a time at which the current is supplied. The phase of the GST corresponding to a reset state or set state is determined by an amorphous volume 15, as illustrated in FIG. 9. As the phase of the GST 12 changes from an amorphous state to a crystal state, the amorphous volume 15 decreases. The amorphous state corresponds to the reset state, and the crystal state corresponds to the set state. The GST 12 has a variable resistance value depending on the amorphous volume 15. That is, data to be written is determined by the amorphous volume 15 of the GST 12, which is formed according to an applied current.

Figure 10:
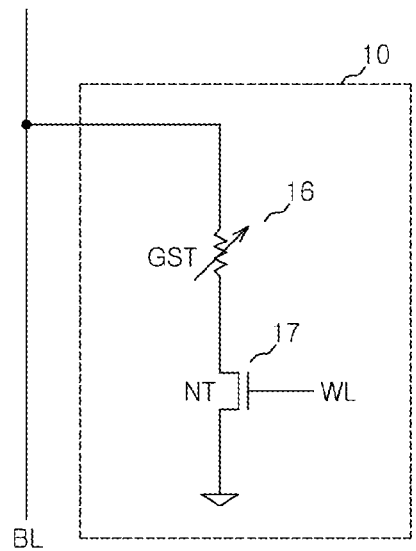
FIGS. 10 and 11 are circuit diagrams illustrating memory cells of the memory cell array of FIG. 1.
Figure 11:
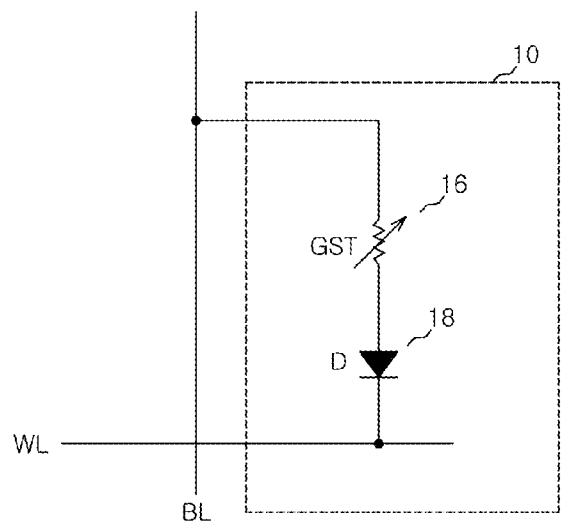

FIGS. 10 and 11 are circuit diagrams illustrating memory cells of the memory cell array of FIG. 1. FIG. 10 illustrates a phase change memory cell including a MOS switch-type selecting element, and FIG. 11 illustrates a phase change memory cell including a diode switch-type selecting element.

Referring to FIG. 10, the memory cell 10 includes a memory element 16 and a selecting element 17. The memory element 16 is connected between a bit line BL and the selecting element 17. The selecting element 17 is connected between the memory element 17 and a ground GND. The selecting element 17 has a gate connected to a word line WL. FIG. 10 illustrates the memory element 16 is connected between the bit line BL and the selecting element 17. However, the selecting element 17 may be connected between the bit line BL and the memory element 16.

The memory element 16 has the same configuration and performs the same operation as the memory element illustrated in FIG. 9. Therefore, the detailed descriptions thereof are omitted herein.

The selecting element 17 includes an NMOS transistor NT. When a predetermined voltage is applied to the word line WL to select the memory cell 10, the NMOS transistor NT is turned on. When the NMOS transistor NT is turned on, a current flows to the memory element 16 through the bit line BL.

Referring to FIG. 11, the memory cell 10 includes a memory element 16 and a selecting element 18. The memory element 16 is connected between a bit line BL and the selecting element 18. The selecting element 18 is connected between the memory element 16 and a word line WL.

The memory element 16 has the same configuration and performs the same operation as the memory element illustrated in FIG. 9. Therefore, the detailed descriptions thereof are omitted herein.

The selecting element 18 includes a diode D. The diode D has an anode connected to the memory element 16 and a cathode connected to the word line WL. When a ground voltage GND is applied to the word line WL to select the memory cell 10, a voltage difference between the anode and the cathode of the diode D is changed. When the voltage difference between the anode and the cathode of the diode D becomes higher than the threshold voltage of the diode D, the diode D is turned on. When the diode D is turned on, the memory element 16 receives a current through the bit line BL.

Figure 12:
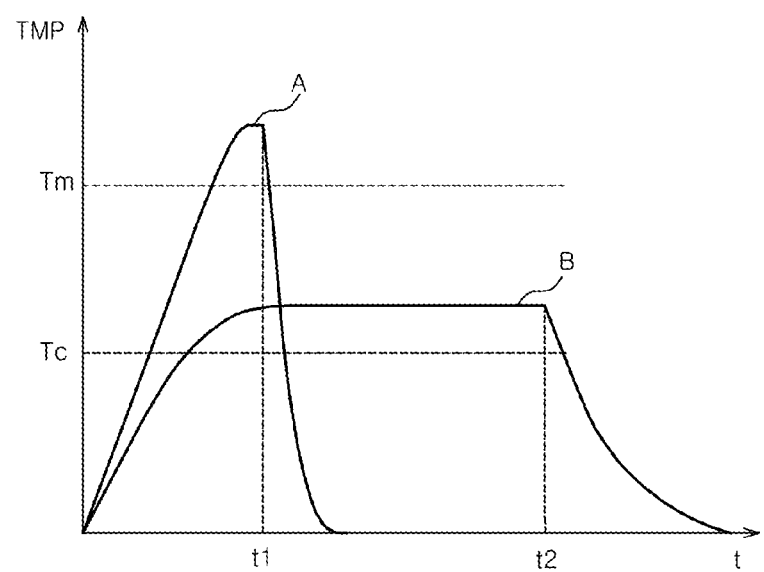
FIG. 12 is a graph explaining the characteristics of phase change materials (GST) illustrated in FIGS. 10 and 11.

FIG. 12 is a graph explaining the characteristics of the phase change materials illustrated in FIGS. 10 and 11. In FIG. 12, a symbol 'A' indicates a condition where the GST becomes the amorphous state (that is, reset state). Furthermore, a symbol 'B' indicates a condition where the GST becomes the crystal state (that is, set state).

When the GST is heated at a higher temperature than a melting temperature Tm during a time t1 and then rapidly quenched, the GST changes into the amorphous state. When the GST is in the amorphous state, the memory cell 10 stores data '1'. On the other hand, when the GST is heated at a higher temperature than a crystallization temperature Tc during a time t2 longer than the time t1 and then slowly quenched, the GST changes into the crystal state. Here, the crystallization temperature Tc is lower than the melting temperature Tm. When the GST is in the crystal state, the memory cell 10 stores data '0'.

While certain embodiments have been described above, it will be understood to those skilled in the art that the embodiments described are by way of example only. Accordingly, the semiconductor memory device described herein should not be limited based on the described embodiments. Rather, the semiconductor memory device described herein should only be limited in light of the claims that follow when taken in conjunction with the above description and accompanying drawings.

What is claimed is:

1. A semiconductor device comprising:
    a memory cell array comprising a plurality of blocks each comprising a memory cell arranged at an intersection between a word line and a bit line; and
    a block state information storing unit configured to store state information of the respective blocks,
    wherein the block state information storing unit stores lock state information to partially limit access to each of the blocks in response to a power-up signal, and
    wherein the state information is divided into an unlock state in which read, program, and erase operations are possible to perform on the plurality of memory blocks, a lock state in which program and erase operations are impossible to perform on the plurality of memory blocks, and a lock-down state in which read, program, and erase operations are impossible to perform on the plurality of memory blocks.

2. The semiconductor device according to claim 1, wherein the block state information storing unit simultaneously stores the lock state information.

3. The semiconductor device according to claim 1, wherein the block state information storing unit comprises a plurality of unit cells corresponding to the respective blocks.

4. The semiconductor device according to claim 3, wherein each of the unit cells comprises:
    an upper cell configured to store an upper bit of the state information; and
    a lower cell configured to store a lower bit of the state information.

5. The semiconductor device according to claim 4, wherein each of the upper and lower cells comprises a plurality of logic gates.

6. The semiconductor device according to claim 5, wherein each of the upper and lower cells comprises a NAND gate, and an inverter having an input terminal connected to an output terminal of the NAND gate and an output terminal connected to an input terminal of the NAND gate.

7. The semiconductor device according to claim 5, wherein each of the upper and lower cells comprises a NOR gate, and an inverter having an input terminal connected to an output terminal of the NOR gate and an output terminal connected to an input terminal of the NOR gate.

8. The semiconductor device according to claim 4, wherein the block state information storing unit further comprises a write driver comprising:
- an upper write driver configured to control a program operation for the upper cell; and
- a lower write driver configured to control a program operation for the lower cell.

9. The semiconductor device according to claim 8, wherein, when the unit cells store lock-down state information to limit all access to the blocks, the write driver controls the state information stored in the unit cells not to be changed.

10. The semiconductor device according to claim 9, wherein the write driver controls the lock-down state information to be maintained before a power-up operation is performed.

11. The semiconductor device according to claim 8, wherein the upper write driver comprises:
- a pull-up transistor;
- a first logic gate configured to control the pull-up transistor in response to a write driver enable signal and upper state information;
- a pull-down transistor; and
- a second gate configured to control the pull-down transistor in response to the write driver enable signal and the upper state information.

12. The semiconductor device according to claim 11, wherein the first logic gate comprises a NAND gate, and
wherein the second logic gate comprises an AND gate.

13. The semiconductor device according to claim 12, further comprising a control logic configured to control read, program, and erase operations for the memory cell, and
the control logic refers to the state information of the memory blocks, stored in the block state information storing unit, and determines whether or not access the memory blocks according to the reference result.

14. The semiconductor device according to claim 1, wherein the memory cell comprises:
- a memory element having one end connected to the bit line and formed of a phase change material; and
- a selecting element configured to select the memory element.

15. A semiconductor device comprising:
- an upper cell configured to store an upper bit of state information; and
- a lower cell configured to store a lower bit of state information,
wherein the state information is divided into:
- an unlock state in which read, program, and erase operations are possible to perform on the plurality of memory blocks;
- a lock state in which program and erase operations are impossible to perform on the plurality of memory blocks; and
- a lock-down state in which read, program, and erase operations are impossible to perform on the plurality of memory blocks.

16. The semiconductor device according to claim 15, wherein each of the upper and lower cells comprises a NAND gate, and an inverter having an input terminal connected to an output terminal of the NAND gate and an output terminal connected to an input terminal of the NAND gate.

17. The semiconductor device according to claim 15, wherein each of the upper and lower cells comprises a NOR gate, and an inverter having an input terminal connected to an output terminal of the NOR gate and an output terminal connected to an input terminal of the NOR gate.

18. The semiconductor device according to claim 15, further comprising:
- an upper write driver configured to control a program operation for the upper cell; and
- a lower write driver configured to control a program operation for the lower cell.

19. The semiconductor device according to claim 18, wherein the upper write driver comprises:
- a pull-up transistor;
- a first logic gate configured to control the pull-up transistor in response to a write driver enable signal and upper state information;
- a pull-down transistor; and
- a second gate configured to control the pull-down transistor in response to the write driver enable signal and the upper state information.

* * * * *